United States Patent [19]

Hurd

[11] Patent Number: 5,117,192
[45] Date of Patent: May 26, 1992

[54] CONTROL CIRCUITRY FOR QUARTZ CRYSTAL DEPOSITION MONITOR

[75] Inventor: Clarence Hurd, Baldwinsville, N.Y.

[73] Assignee: Leybold Inficon Inc., New York, N.Y.

[21] Appl. No.: 464,371

[22] Filed: Jan. 12, 1990

[51] Int. Cl.$^5$ ............................................. G01R 27/02
[52] U.S. Cl. .................................... 324/727; 310/316
[58] Field of Search .................. 324/727, 71.1, 71.5; 310/316

[56] References Cited

U.S. PATENT DOCUMENTS

| | | | |
|---|---|---|---|
| 3,689,747 | 9/1972 | DiMilia et al. . | |
| 3,864,161 | 2/1975 | Thompson . | |
| 3,967,143 | 6/1976 | Wartanabe et al. | 310/316 |
| 4,158,805 | 6/1979 | Ballato | 324/727 |
| 4,166,784 | 9/1979 | Chapin et al. . | |
| 4,207,836 | 6/1980 | Monaka . | |
| 4,275,363 | 6/1981 | Mishiro et al. | 310/316 |
| 4,311,725 | 1/1982 | Holland . | |
| 4,447,782 | 5/1984 | Rutkowski | 324/727 |
| 4,578,634 | 3/1986 | Healey, III et al. | 324/727 |
| 4,579,083 | 4/1986 | Boivin . | |
| 4,816,743 | 3/1989 | Harms et al. . | |
| 4,817,430 | 4/1989 | Benes et al. . | |
| 4,888,824 | 12/1989 | Anderson et al. | 324/671 |

FOREIGN PATENT DOCUMENTS 1465825  3/1989  U.S.S.R. ............................. 324/727

OTHER PUBLICATIONS

H. Bahadur et al., "Physical Acoustics" Vibrational Modes in Quartz Crystals vol. XVI, 1982, pp. 145 ff.

*Primary Examiner*—Kenneth A. Wieder
*Assistant Examiner*—Maura K. Regan
*Attorney, Agent, or Firm*—Wall and Roehrig

[57] ABSTRACT

A monitoring circuit monitors a piezoelectric crystal for changes in its resonant frequency as a film of material is vacuum deposited on it, e.g. to control a source of vapors of the material. A controllable frequency generator generates a drive signal of a accurately known frequency and phase within a band of RF frequencies that includes the resonant frequency of the crystal. The RF signal is applied through a duplexing circuit to the crystal, and a response signal is applied through the duplexing circuit to a signal amplifier and limiter circuit to a phase detector. The phase detector is also supplied with the RF drive signal, and has a phase output signal which is zero when the crystal is at resonance, and is negative or positive when the applied RF signal is below or above resonance, respectively. A micro-controller can be employed for controllably sweeping the frequency of the drive signal and then monitoring the frequencies at which the phase detector signal indicates zero, to identify the frequency of each of the one or more resonances. A cable compensation control circuit can also be coupled to the duplexing circuit for balancing the reactance of the conductive paths associated with the crystal. This can include a voltage controlled capacitance and a portion of a transformer within the duplexing circuit.

7 Claims, 2 Drawing Sheets

CONTROL CIRCUITRY FOR QUARTZ CRYSTAL DEPOSITION MONITOR

BACKGROUND OF THE INVENTION

This invention relates to quartz crystal sensors for monitoring the rate of deposition of thin films on a substrate. The invention is more specifically directed to improved electronic circuitry to sustain the oscillation of a piezoelectric quartz crystal and to measure its resonance frequency or frequencies.

Piezoelectric quartz crystals are commonly used to monitor the film thickness and to control the rate of film growth for vacuum deposited thin films The basic technique is described, e.g. in U.S. Pat. Nos. 4,817,430, 4,207,836, and 4,311,725. A multiple-crystal film thickness sensor is described in U.S. patent application Ser. No. 430,428, filed Nov. 2, 1989, which has a common assignee herewith. These monitors or sensors can be used both to monitor the vacuum deposition process and to control accurately the amount of material deposited and the rate of deposit onto a surface. The resonance frequency of the crystal drops with increasing thickness of the deposited film. As the film is deposited on the monitoring crystal, the sharpness of the resonance also degrades, and it becomes more and more difficult to distinguish the principal crystal resonance from other resonances and to measure its frequency precisely. That is, the natural resonances of any crystal depend upon total mass and geometry.

In these deposition monitors, there is typically one or more piezoelectric crystals which can be quartz, barium titanate, or other material. The crystals are connected into a resonant circuit so that the natural resonant frequency of one crystal can be monitored. The natural resonance frequency drops as material is coated onto the crystal. As the material builds up, the sharpness of resonance diminishes, and eventually a point is reached in which the crystal can no longer monitor the process accurately or effectively. The crystal must then be replaced. As the deposit on the crystal becomes thicker and thicker, the accumulated mass induces a change in the resonant frequency of the crystal and oscillator system. None of the previous or current monitoring circuits compensate or account for the density of the deposited material, nor do any of these monitoring circuits use the knowledge of the acoustic shear wave velocity to correct the behavior of the sensor circuitry to match the crystal. Commercially available process controllers based on the piezoelectric quartz crystal can make thickness measurements with a resolution smaller than one angstrom. These process controllers can use this information to make appropriate deposition rate corrections by changing the power to the deposition source. The power level can be changed as often as five to ten times per second. These crystals are extremely sensitive to added mass. A monolayer of copper added to a 6 MHz monitor crystal reduces its resonance frequency by roughly 20 Hz. To a first order approximation, the sensitivity is proportional to the deposited material density, and a material of higher density than copper will result in a sensitivity on the order of ten Hz per angstrom. The instrument performance is therefore determined by how well the frequency can be measured in a very short period of time. Any instability in the frequency of the oscillator/crystal system results in an inaccuracy of the measured film thickness. Because the thickness information is used in a feedback control system, measurement errors can cause the rate of deposition to become unstable. If the frequency instability is large it can also produce significant error in the final thickness of the film. Commercially available deposition process controllers obtain the resonance of the quartz crystal by utilizing a so-called "period" measurement technique. A stable, high-frequency reference oscillator is used as a time base to measure the time interval or period which is, of course, determined by the frequency of the monitor crystal. Any instability or lack of precision in the reference oscillator will be indistinguishable from a change in the resonant frequency in the monitor crystal. This will produce an error in the film's apparent thickness.

Measurement noise or random error can be reduced by using a longer time interval for greater smoothing due to averaging. Greater accuracy can also be obtained by designing a more stable reference oscillator to operate at a higher frequency.

Present deposition process controllers employ reference oscillators that range in frequency from 10 MHz to 225 MHz. The best of these have good enough stability to measure the monitor crystal frequency to a resolution of 0.2 Hz in an interval or period of 200 milliseconds. This corresponds to an error in the deposited film thickness of well under one angstrom for materials of average density.

While a one-angstrom error in final thickness in the deposited film is insignificant, measurement errors of fractions of an angstrom can be quite important in rate control, especially at low deposition rates. Feedback control stability for many types of evaporators requires that thickness measurements be taken many times per second. It is customary to measure the film thickness and update the control loop at least four times a second. Even more frequent control is often desirable.

At low deposition rates, the change in films thickness, and the corresponding change in crystal frequency between successive measurements is very small. For materials of low density, the change in the quartz crystal frequency from measurement to measurement is no greater than the measurement error from noise and reference oscillator precision. Thus, lack of precision can be a very serious problem in stable rate control at low deposition rates, because the controller cannot distinguish between frequency changes due to added material and frequency changes due to noise and/or uncertainty. When actual frequency changes are of the same order as the errors, the commands from the control system become erratic, and control over deposition rate is seriously degraded.

In the conventional measurement systems thus far described, there are two sources of uncertainty: measurement precision limitations and instabilities of the monitor crystal. The first limitations result from short sample times and from the stability limitations in the reference oscillator as previously described. The second limitations involve instabilities in the monitor crystal and in the active oscillator system, and these further degrade the measurement accuracy Piezoelectric crystals are attractive as frequency stabilizing elements, in addition to their utility as deposition monitor transducers, because they possess a wide range of phase shift over a narrow range of frequencies. This property gives the crystal oscillator a great frequency stability, as the phase requirement for stable oscillation can be met over a quite narrow range of frequencies. This frequency stability can be achieved even in a very noisy environment because the phase component of the noise is cancelled out with a small change in frequency.

However, when the quartz crystal is used as a deposition monitor, this desirable phase/frequency relationship deteriorates as mass is added to the crystal. When the added mass from the deposition becomes significant, more frequency change is required to produce the same amount of phase shift. Any noise in the oscillator and crystal circuit will induce a significant frequency change that is not mass-related. This is a major cause of instability and deterioration of crystal performance near the end of the crystal's life.

Near the end of the crystal's useful life it may be unable to produce sufficient phase shift in the fundamental shear mode to satisfy the requirements for an oscillator. In this case another oscillation mode of the crystal may be better able to provide the required phase shift and gain. The aged crystal will cause the system to oscillate at that mode and a new frequency will result. Present measurement systems cannot avoid this change between oscillation modes and an associated instrument will infer erroneous thickness information. The change between these oscillating modes is called "mode hopping," and presents a serious problem in terms of rate control and final thickness cutoff.

If there is no other oscillation mode that will satisfy the phase and gain requirements for an oscillator, the system will fail to function altogether. Then the ability to measure thickness is lost. However in some cases the measurement system can sense that this has occurred and avoid generating false values. At that stage, a fresh crystal must be swapped for the existing one, but the process must be totally stopped so the vacuum chamber can be opened.

OBJECTS AND SUMMARY OF THE INVENTION

Accordingly, it is an object of this invention to provide a deposition monitoring circuit which avoids the drawbacks of the prior art.

It is another object of this invention to provide a deposition monitoring circuit that actively monitors the frequency change of the crystal resonant frequencies, without relying on the crystal to be part of the oscillator driver circuit.

It is a further object of this invention to provide an intelligent monitor circuit that avoids mode-hopping problems, and which can operate with crystals which would be well beyond their normal life cycles in other, conventional systems.

It is yet another object of this invention to provide a monitoring circuit that can determine the parallel component of the fundamental shear wave mode of an AT-cut quartz crystal, the series component of the fundamental shear wave mode of an AT-cut quartz crystal, the series or parallel component of any particular arbitrary mode of an AT-cut quartz crystal, or the series or parallel component of any arbitrary mode of an arbitrary cut of a piezoelectric crystal.

A further object of this invention is to ensure that the observed oscillating mode of a crystal is a specific predetermined desired mode for that crystal, so that the mass adhered to the face of the crystal can be measured with greater accuracy and reliability.

A still further object of the invention is to provide an intelligent monitoring circuit which is capable of rapidly testing a piezoelectric crystal with various frequencies and establishing and storing the frequencies that correspond to specific resonance modes of the crystal.

Another object of this invention is to provide an intelligent monitoring circuit which can store pre-calibrated resonance data for a number of piezoelectric crystals, so that any of the crystals can be employed for monitoring of deposition film thickness immediately after replacement.

A still further object of the invention is to provide a crystal monitoring circuit that includes means to compensate for undesirable parasitic reactances from cables, crystal holders, flanges, or other elements.

In accordance with an aspect of this invention, the crystal deposition monitor has an independent oscillator system with intelligence capability. The independence of the oscillator permits a range of frequencies to be applied to the crystal. The intelligence feature functions to identify and store the resonances, and to measure and analyze how monitor crystals respond to frequencies in the vicinity of those resonances. With these features, it can be verified that the oscillation modes of the crystals are the fundamental shear modes, but other modes of oscillation can be located and identified, and their frequencies measured. Even if noises are present in the circuitry that might induce a conventional oscillator to mode-hop or to cease oscillation, the intelligent oscillator can continue to differentiate noise from crystal response, and will maintain the oscillation in the desired mode. The crystal deposition monitor of this invention can continue to monitor the crystal's behavior, even when the crystal can no longer provide sufficient phase shift to start oscillating in a conventional oscillating system. With the monitoring circuit of this invention, the manufacturer of thin films can control film thickness more precisely throughout the life of the crystal, and especially near the end of the crystal's useful life, in addition to obtaining a much longer crystal life than is possible with present techniques.

The above and many other objects, features and advantages of this invention will become apparent from the ensuing description of a preferred embodiment of this invention, which should be read in conjunction with the accompanying Drawing.

DETAILED DESCRIPTION OF A PREFERRED EMBODIMENT

Figure 1:
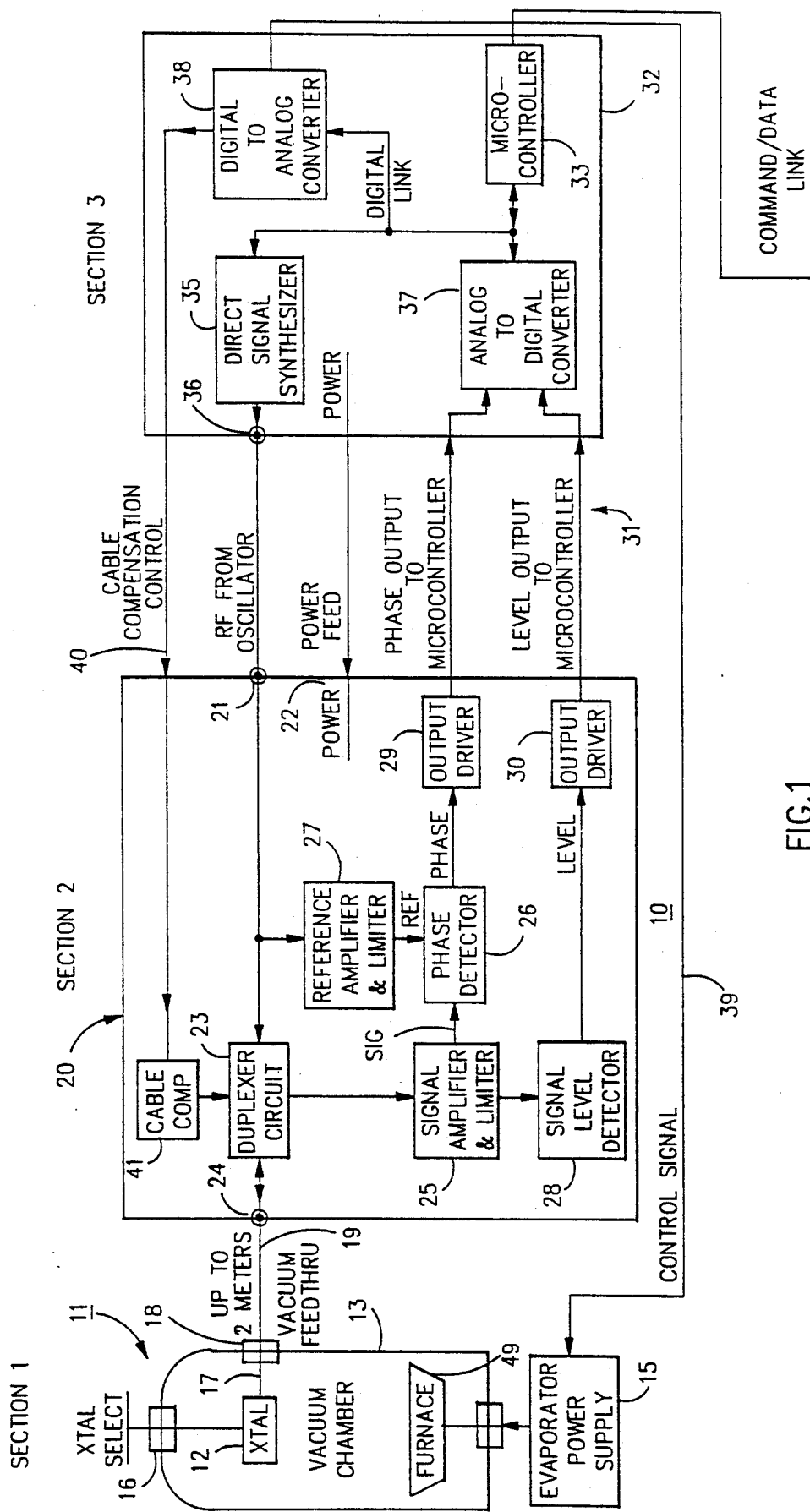
FIG. 1 is a schematic block diagram of a piezoelectric crystal detector and its associated control circuitry according to one preferred embodiment of this invention.

With reference to the Drawing, initially to FIG. 1, a film thickness monitor system 10 has a first section 11 in which a piezoelectric crystal 12 has one face exposed to vapors within a vacuum deposition chamber 13. The chamber also contains an evaporator furnace 14 to which there is connected an evaporator power supply 15. A crystal selection mechanism 16 is also provided in connection with the crystal 12, in the case that the crystal 12 is contained within a multi-crystal detector. From the crystal 12 a pair of leads 17 extend to feed-through 18 and connect with a cable 19 external to the chamber 13. The cable 19 connects with a second section 20, which can be remoted from chamber 13 a distance up to about two meters.

The second section 20 has an RF input 21 and a power input 22. The RF input 21 supplies an RF signal of known frequency and phase to an input of a duplexer circuit 23. The duplexer circuit 23 has a first output that supplies the RF signal, via a cable terminal 24 and the cable 19, to the piezoelectric crystal 12. A return signal from the crystal 12 is supplied from a second terminal of the duplexer circuit 23 to a signal amplifier and limiter 25 which supplies a crystal output signal SIG to one input of a phase detector 26. A reference amplifier and limiter 27 has an input coupled to RF input 21, i.e. to the first input of the duplexer circuit 23, in a output that supplies a reference wave REF, that has the same phase and frequency as the oscillator RF signal, to a second input of the phase detector 26. The phase detector has a phase output whose value depends on the phase relationship between the signals SIG and REF.

A signal level detector 28 is coupled to an output of the signal amplifier and limiter 25, and provides an output level that corresponds to the amplitude of the response signal SIG from the crystal 12. A phase output driver 29 and level output driver 30 amplify the phase and level signals respectively, and these are fed to appropriate conductors within a cable 31 that leads to a third section 32 of the film thickness monitor system. In this arrangement, the cable 31 can be up to thirty meters in length without degradation of the quality of the measurements.

Within the third section 32 there is a microcontroller 33 that is connected by means of a multi-channel digital bus 34 to other elements including a direct digital synthesizer 35. This synthesizer 35 produces an RF drive signal at a frequency resolution of 0.005 Hz in a frequency range of 0 to 8 MHz. This precision RF wave is then supplied to an RF output 36 which is connected by a conductor within the cable 31 to the RF input 21 of the second section 20.

An analog-to-digital converter 37 receives the inputs from the phase output driver 29 and level output driver 30, and converts the values thereof to digital form to supply to the microcontroller 33. A digital-to-analog converter 38 has an input connected via digital bus 34 to the microcontroller 33. This converter 38 has a first output that is passed over a control line 39 to the evaporator power supply 15 for controlling the furnace 14 in the first section. The converter 38 also has a second output that is supplied over a conductor 40 in the cable 31 to a cable compensation circuit in the second section 20. The cable compensation circuit 41 is coupled to the duplexer circuit 41 and automatically compensates for any reactance due to the cable 19, feed-through 18, and mountings for the crystal 12.

Figure 2:
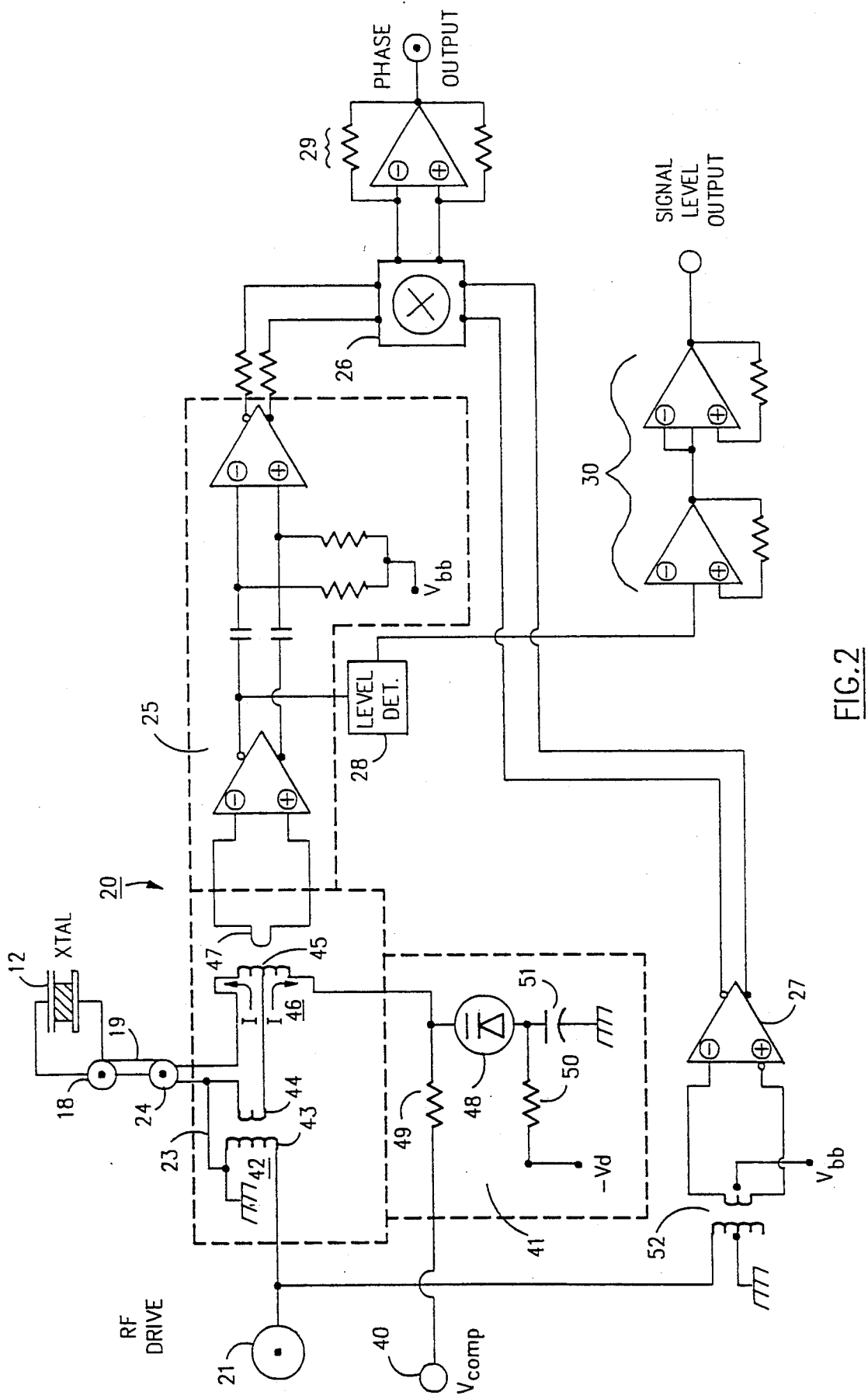
FIG. 2 is a schematic circuit diagram of a portion of the circuitry of FIG. 1.

Details of the second section 20 are shown in the circuit diagram of FIG. 2, in which elements that are also shown in FIG. 1 are identified with the same reference numbers. The duplexer circuit 23 formed of a first transformer 42 that has a primary winding 43 connected to the RF input 21 and a secondary 44 coupled in series with the crystal 12 through the upper one half primary winding 45 of a second transformer 46 and terminal 24. The transformer 46 has a secondary 47 that feeds the signal amplifier and limiter circuit 25. The lower end of the second transformer primary 45 connects to the cable compensation circuit 41. In one embodiment, the circuit 41 has a varactor diode 48, i.e. a variable capacitance diode, having its cathode end coupled to the transformer secondary 45 and also coupled through a resistor 49 to a terminal at which a compensation voltage $V_{comp}$ is applied over the conductor 40. The varactor 48 has its anode end connected through another resistor 50 to a point of negative reference voltage $-V_d$, and through a capacitor 51 to ground.

The RF input 21 is connected through an impedance-matching transformer 52 to inputs of the reference amplifier and limiter 27. In this embodiment, the phase detector 26 is a multiplier circuit having inputs connected respectively to the outputs of the signal amplifier and limiter 25 and the reference amplifier and limiter 27. Also in this embodiment, the level detector 28 is connected to a primary stage of the signal amplifier and limiter 25 to produce the signal level that is supplied through the driver 30 as a signal level output to the A/D converter 37.

The holding and cooling apparatus for the quartz crystal 12 are not shown here, although many varieties are known in the art.

The key advantage to the operation of the thickness monitor system 10 of this invention is its ability to test the crystal 12 rapidly and accurately to determine its resonance when it is stimulated by specific frequencies. The algorithms to be executed by the microcontroller 33 send frequency instructions to the direct digital synthesizer 35, which uses this information to generate a sinusoidal wave of a precise frequency and phase. The synthesized wave can be precisely altered in frequency and phase in a period on the order of microseconds.

The synthesized RF sine wave is then received in the second section 20 and is supplied through the duplexer circuit 23, which sends the sine wave forward to the crystal 12, while at the same time receiving back the reactance of the crystal 12. The received response wave, i.e., SIG, is separated from the applied wave by the duplexer 33, and this received signal is amplified and limited in the circuit 25, and then is sent to the phase detector 26. At the same time, the synthesized RF wave is supplied as a reference signal, through the amplifying and limiting circuit 27 to the phase detector 26.

When the applied frequency as generated in the synthesizer 35 is at the resonant frequency of the crystal 12, there is ninety-degree phase shift between the reference signal and the response signal that is returned through the duplexer circuit 23. At frequencies several hundred Hertz below the crystal resonance, there is a phase shift of substantially zero degrees between the applied signal and the response signal, while at frequencies several hundred Hertz above the crystal resonance, there is a phase shift approaching one hundred eighty degrees between the applied and response signals. This phase shift is accurately measured in the phase detector 26, and is employed to determine the resonant frequency.

Accuracy in determination of phase of the applied and return signals to and from the crystal 12, is accomplished by processing both the applied and return signals REF and SIG through amplifying and clipping circuitry in the circuits 25 and 27, respectively, and then applying the signals SIG and REF to the phase detector as configured in this preferred embodiment, the output of the phase detector 26 will be at zero volts when the applied signal REF leads the return signal SIG by 90°. The phase detector output then will be a positive or a negative voltage level in accordance with the difference in phase between the signals REF and SIG, so that a discrete sign change is encountered when the synthesized signal is swept through the crystal resonance frequency. The output driver circuitry 29 conditions the phase signal that is sent as a voltage to the A/D converter 37 in the third section 32. Then, the converter 37 changes the phase difference from a voltage level to digital signal suitable to be handled by the microcontroller 33. Here, the microcontroller is suitably programmed with a strategy for controlling the frequency and phase of the synthesizer 35, so that the crystal 12 is maintained in its oscillating wave mode of greatest interest. This strategy can be, in general terms, a digital feed-back control loop that maintains the output of the A/D converter 37 at a zero level by constantly changing the frequency and phase output of the synthesizer 35.

The components to constitute the direct digital synthesizer 35 and the analog-to-digital converter 37 can be obtained commercially. Suitable components are available to permit the frequency response of the crystal 12 to be tested on the order to the 200,000 times per second with an 8 bit A/D converter 37. This corresponds to a slew rate of 128 KHz/second with a precision of 0.005 Hz, which is sufficient for virtually all purposes. The simplest control strategy can employ testing at fixed frequency intervals, with either increases or decreases in the synthesizer frequency, depending on the sign of the output of the converter 37. More complex strategies involve using not only the sign information, but also the magnitude of the output to test frequency intervals that are closer together or further apart, i.e., to test the quality of the resonance. The smallest frequency differences that can be tested are limited only by frequency generation capability of the synthesizer 35, which at present technology is on the order of 0.005 Hz. The limitation on the detectability of resonance is established by the noise of the circuits and noise of the deposition system, as well as by the resolution of the converter 37. This detectability at present is 0.005 Hz, and therefore sets a practical resolution limit of this system.

The signal level detector 28 that is shown in the second section 20 can be employed to enhance the measurement system, and provide means for measuring crystal activity or life. Whenever mass is added to the crystal 12, i.e., from deposition, the phase-frequency relationship deteriorates, and this reduces the amplitude of the return or response signal SIG received back from the crystal at its resonance. The level of the signal SIG is then monitored in the microcontroller 33, and the information is used to indicate an impending or possible crystal failure. Appropriate action can be taken manually by the operator, or automatically by the microcontroller 33, to ensure uninterrupted deposition monitoring and controlling. Appropriate algorithms may be developed to project the probable remaining deposition life, based on the signal intensity, and the history of this particular crystal 12, and the class of crystals to which it belongs.

The cable compensation circuit 41 is employed for electronically tuning the duplexer circuit 23 to eliminate undesirable parasitic reactances from the crystal holder, the vacuum feed-through 18, the various lengths of cable, e.g. 19, and other sources of stray capacitance. In this compensation circuit 41, the variable reactance 48 operates with the transformer winding 45. The RF drive signal of a specific frequency is applied to the center tap of the winding 45, and is then fed in series to the variable reactance 48. The capacitance of this element 48 is established by adjusting the applied compensation voltage $V_{comp}$, until there is no signal output from the secondary winding 47 of the transformer 46. This, of course, occurs when the capacitance variable capacitor 48 has the same capacitance value as the parasitic reactance on the leg of the circuit between the duplexer circuit 23 and the crystal 12. When a balance is established, the ac current flowing through each half of the transformer primary 45 is equal and of opposite phase. The procedure for cancelling parasitic reactance can be accomplished with a suitable program in the microcontroller 33, e.g. by repetitive tests applying a dc voltage to the variable capacitor 48. The process of cancelling parasitic reactance needs to be carried out only at set-up of the crystal sensor, and need not be changed during the entire deposition monitoring over the life of the sensor.

In the case of a multiple crystal detector, the compensation voltage $V_{comp}$ can be stored for each individual crystal 12, and applied automatically upon change-over of one crystal for another.

The critical limitation in this invention is the ability to change the synthesized frequency fast enough to obtain a zero crossing in the A/D converter 37 even though that frequency is changing due to the deposition. With the film thickness monitoring system 10 of this invention, the changing resonant frequencies of the crystal 12, e.g. due to accumulation of deposition, can be measured much more often than in the circuitry of the prior art. Precision of measurement is not limited by frequency and stability of the oscillating crystal 12, nor by the time interval necessary to accumulate counts or clock pulses in an accumulator. In this invention, what is important is the combination of the number of trials that can be tested in one second and the size of the frequency intervals between trials. In a practical system, the resolution of frequency measurement is established by the size of this frequency increment. The increment is chosen according to the expected speed that the crystal will change frequency due to mass loading. The product of the frequency increment between trials times the number of trails per unit time establishes the maximum slew rate. The slew rate must exceed the change in resonance frequency of the crystal 12 per unit time by some margin, so that the applied frequency that is being swept regularly and frequently causes the phase detector 26 to pass through the zero level, i.e. 90° phase difference. A minimum practical value for the slew rate margin is in the order of two to three times the expected rate of frequency change.

An important advantage of the AT-cut quartz crystal is that the desired fundamental shear wave mode of oscillation is the lowest frequency resonance of any of the possible excited modes. The microcontroller system of this invention can be capable of employing this information to identify the particular mode of oscillation for the crystal 12. A frequency sweep initiated at start-up of an operation, i.e., a broad frequency sweep that starts at a low frequency and increases towards higher frequencies, will first encounter the fundamental shear mode, and then other crystal resonances, such as the first and second anharmonics, which may also prove to be useful. This sweep consumes only a very small period of time, and can be initiated as frequently as required, based on the environmental noise and on the experience of the operator. If there is any discontinuity of the monitored crystal frequency, a frequency sweep can be again initiated and the desired oscillating mode can be established. The frequency/phase relationship of the crystal 12 becomes far less critical than previously, because this knowledge of the fundamental shear wave frequency can be obtained, even for an aged crystal in which that mode could not be sustained with oscillator circuits of the prior art.

While this invention has been described in detail with reference to a single preferred embodiment, it should be understood that the invention is not limited to that precise embodiment. Rather, many modifications and variations would present themselves to those who are skilled in the art without departing from the scope and spirit of this invention, as defined in the appended claims.

What is claimed is:

1. Monitoring circuit for monitoring at least one resonant frequency of a piezoelectric crystal on which a film of material is being vacuum deposited to control a source of vapors of said material; the monitoring circuit comprising:
   a) controllable frequency generating means for generating a drive signal at a frequency, independent of the crystal resonance frequency, selected within a band of RF frequencies that includes the at least one resonant frequency of said piezoelectric crystal;
   b) a duplexing circuit having an input coupled to said frequency generating means to receive said drive signal therefrom, a crystal terminal coupled to said crystal and supplying the drive signal to said crystal and receiving a response signal reflected back from the crystal, and an output terminal at which said response signal appears, the response signal having the frequency of said drive signal but a phase that depends on the proximity of the drive signal frequency to a resonant frequency of said crystal;
   c) phase detector means supplied with said drive signal and said response signal and having a phase output signal whose value indicates the relative phase of the drive and response signals, from a negative level through zero to a positive level; and
   d) controller means coupled to said frequency generating means and said phase detector means for controllably changing the frequency of said drive signal and monitoring the frequency at which said phase detector signal indicates a zero level to identify the frequency of each of said one or more resonances.

2. Monitoring circuit according to claim 1 wherein said controller means sweeps said drive signal frequency at a slew rate exceeding the rate at which said crystal resonance changes with increased film thickness.

3. Monitoring circuit according to claim 1 further comprising a cable compensation control circuit coupled to said duplexing means for controllably balancing the impedance of conductive paths connecting the duplexing means to the crystal, the cable control circuit including a voltage controlled impedance device coupled to the duplexing means and a control terminal to which a predetermined control voltage level is applied to select a predetermined balancing impedance for said voltage controlled impedance device.

4. Monitoring circuit according to claim 3 wherein said controller means includes means to generate said predetermined control voltage level, according to a predetermined value stored in said controller means.

5. Monitoring circuit according to claim 1 further comprising a response signal level indicating circuit having an input coupled to said duplexing circuit output terminal and an output providing to said controller a level signal that indicates the level of said response signal.

6. Monitoring circuit according to claim 1 wherein said phase detector means includes a signal amplifier and limiter circuit having an input connected to the output terminal of said duplexing circuit and an output providing an amplified and limited version of said response signal, a reference amplifier and limiter circuit having an input connected to the input of the duplexing circuit and an output providing an amplified and limited version of said drive signal, and a phase detector having inputs connected respectively to the outputs of the signal amplifier and limiter circuit and the reference amplifier and limiter circuit, and an output providing said phase output signal.

7. Monitoring circuit according to claim 6 wherein said phase detector circuit is a multiplier.

* * * * *